United States Patent
Agari et al.

(10) Patent No.: US 10,297,501 B2
(45) Date of Patent: May 21, 2019

(54) METHOD FOR DIVIDING WAFER INTO INDIVIDUAL CHIPS

(71) Applicant: DISCO CORPORATION, Tokyo (JP)

(72) Inventors: Masamitsu Agari, Tokyo (JP); Bae Tewoo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/710,557

(22) Filed: Sep. 20, 2017

(65) Prior Publication Data

US 2018/0082897 A1  Mar. 22, 2018

(30) Foreign Application Priority Data

Sep. 21, 2016  (JP) ................. 2016-183870

(51) Int. Cl.
| | |
|---|---|
| *H01L 21/78* | (2006.01) |
| *B23K 26/00* | (2014.01) |
| *B23K 26/53* | (2014.01) |
| *H01L 21/683* | (2006.01) |
| *H01L 21/67* | (2006.01) |
| *H01L 21/786* | (2006.01) |

(52) U.S. Cl.
CPC .......... *H01L 21/78* (2013.01); *B23K 26/0093* (2013.01); *B23K 26/53* (2015.10); *H01L 21/67132* (2013.01); *H01L 21/6836* (2013.01); *H01L 21/786* (2013.01); *H01L 2221/6834* (2013.01); *H01L 2221/68327* (2013.01)

(58) Field of Classification Search
CPC ........ B23K 26/53; B23K 26/0093; C09J 5/06; B28D 5/0011; H01L 21/268; H01L 21/6836; H01L 21/78
See application file for complete search history.

(56) References Cited

U.S. PATENT DOCUMENTS

| | | | | |
|---|---|---|---|---|
| 2009/0230514 A1* | 9/2009 | Kohda | ................ | H01L 33/0095 257/615 |
| 2015/0038062 A1* | 2/2015 | Umeda | ............. | H01L 21/67219 451/70 |
| 2015/0136312 A1* | 5/2015 | Wei | ..................... | H01L 21/6835 156/248 |
| 2017/0011949 A1* | 1/2017 | Saiki | .......................... | C09J 7/29 |

FOREIGN PATENT DOCUMENTS

WO   WO 2003/077295   9/2003

* cited by examiner

*Primary Examiner* — Daniel Luke
(74) *Attorney, Agent, or Firm* — Greer Burns & Crain, LTD.

(57) ABSTRACT

A wafer has a front face that is partitioned by a plurality of streets crossing with each other into a plurality of regions in each of which a device is formed. A surface protective tape is adhered to the front face of the wafer. Then a laser beam having a wavelength transparent to the wafer is irradiated along the streets from a rear face side of the wafer to form a modified layer inside the wafer. Then the wafer is ground from the rear face side to thin the wafer. When the surface protective tape is applied, the surface protective tape is heated. When the modified layer is formed, cracks extend from the modified layer to the front face of the wafer. When ground, the wafer is divided into individual chips with the cracks serving as boundaries.

1 Claim, 3 Drawing Sheets

METHOD FOR DIVIDING WAFER INTO INDIVIDUAL CHIPS

BACKGROUND OF THE INVENTION

Field of the Invention

The present invention relates to a processing method for a wafer.

Description of the Related Art

In a step of processing a wafer to fabricate a chip or the like, in order to thin a wafer having devices formed on the front face thereof, for example, the rear face side of the wafer is ground. Thereafter, the wafer is divided to form individual chips. When the wafer is divided, a modified layer that serves as a start point of division is formed in the wafer along latticed streets by a laser processing apparatus, and then external force is applied to the wafer such that a crack extends in the thicknesswise direction of the wafer from the modified layer.

For such a fabrication step of chips as described above, for example, as indicated in PCT Patent Publication No. WO03/077295, a step of carrying out grinding of the rear face side and division of a wafer into chips at the same time is investigated. At this step, a modified layer is formed in a wafer along streets by a laser processing apparatus in advance, and thereafter, the rear face side of the wafer is ground to thin the wafer while a crack is extended from the modified layer to divide the wafer. If division and grinding are carried out at the same time in this manner, then the step can be simplified.

SUMMARY OF THE INVENTION

Although, at such a step as described above, when grinding is being performed, cracks extend from the modified layer and gaps along which the wafer is to be divided are formed, the gaps are very narrow. Then, the grinding is continued also after the gaps are formed, the chips formed on the wafer are moved by force applied thereto upon grinding. When the wafer is divided along the latticed streets, since a plurality of chips are placed into a state in which they are arrayed densely in a grid-like pattern, if a chip is moved by grinding, then a corner portion of the chip is contacted with a corner portion of a different chip positioned adjacent the corner portion of the chip. Since a corner portion of a chip is vulnerable to impact, if corner portions are contacted with each other and acted upon by impact, then the chips are likely to suffer from damage such as chipping or cracking. Since any damaged chip is unacceptable, contact between corner portions of chips matters particularly.

To the front face of a wafer, a surface protective tape for protecting the surface is stuck before grinding is carried out, and also after gaps are formed in the wafer, the chips remain supported on the surface protective tape. However, since generally the sticking force (adhesive strength) of the surface protective tape is not so strong that movement of chips by grounding can be prevented fully, the surface protective tape cannot prevent contact between corners of chips. The surface protective tape is used in order to protect the surface of the wafer such that devices formed on the surface of the chip are not damaged, and if the surface protective tape is stuck to the wafer with strength of such a degree that the function of the surface protective tape is exhibited, then no higher sticking force (adhesive strength) is required. Therefore, if the surface protective tape is merely stuck to the wafer, then movement of chips of the wafer cannot be suppressed sufficiently, and such a problem as described above occurs.

The present invention has been made in view of such a problem as described above, and it is an object of the present invention to provide a processing method for a wafer by which a wafer can be divided while impact that acts upon a corner portion of a chip is suppressed thereby to suppress occurrence of damage to the chip such as chipping or cracking.

In accordance with an aspect of the present invention, there is provided a processing method for a wafer having a front face that is partitioned by a plurality of streets crossing with each other into a plurality of regions in each of which a device is formed. The processing method includes a surface protective tape sticking step of sticking a surface protective tape to the front face of the wafer; a modified layer formation step of irradiating, after the surface protective tape sticking step is carried out, a laser beam having a wavelength transparent to the wafer along the streets upon the wafer from a rear face side of the wafer to form a modified layer in an inside of the wafer; and a grinding step of grinding, after the modified layer formation step is carried out, the wafer from the rear face side to thin the wafer. In the surface protective tape sticking step, the surface protective tape is stuck while the surface protective tape is heated. In the modified layer formation step or in the grinding step, cracks are formed to extend from the modified layer to the front face of the wafer. In the grinding step, the wafer is divided into individual chips with the cracks serving as boundaries.

It is to be noted that, in a form of the present invention, the processing method of a wafer according may be configured such that the plurality of streets include a first street extending in a first direction and a second street extending in a second direction crossing with the first direction; the modified layer formed in the modified layer formation step includes a first modified layer extending along the first street and a second modified layer extending along the second street; the first modified layer has a first portion on one side and a second portion on the other side across the second street, and in the modified layer formation step, the first portion of the first modified layer and the second portion of the first modified layer are formed in a displaced relationship from each other in the second direction.

In the processing method for a wafer according to the one aspect of the present invention, the surface protective tape is stuck in a heated state to the front face of the wafer. The surface protective tape is configured from a base material and a glue layer, and if the glue layer is heated, then it is softened and the close contactness thereof with the front face of the wafer enhances. Consequently, when the wafer is divided into individual chips, since the chips are supported firmly by the surface protective tape, contact between corner portions of chips is suppressed. As a result, occurrence of damages to the chips such as chipping or cracking is suppressed.

Accordingly, according to the one aspect of the present invention, a processing method for a wafer is provided by which a wafer can be divided while occurrence of damages such as chipping or cracking to chips is suppressed.

The above and other objects, features and advantages of the present invention and the manner of realizing them will become more apparent, and the invention itself will best be understood from a study of the following description and the appended claims with reference to the attached drawings showing a preferred embodiment of the invention.

DETAILED DESCRIPTION OF THE PREFERRED EMBODIMENT

Figure 1A:
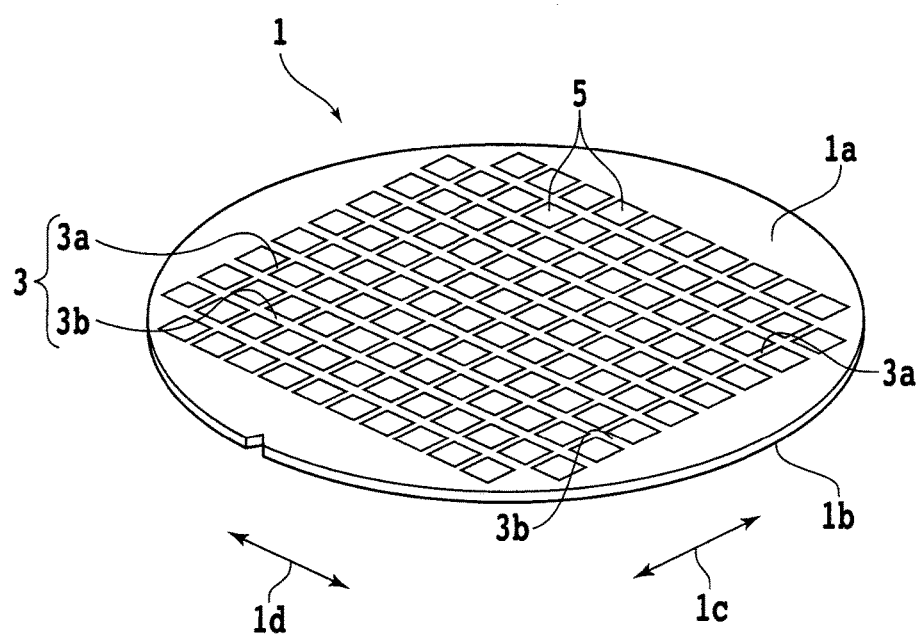
FIG. 1A is a perspective view depicting an example of a wafer.

An embodiment of the present invention is described. A wafer that is a workpiece of a processing method according to the present embodiment is described. FIG. 1A is a perspective view depicting an example of the wafer. The wafer 1 that is a workpiece in the processing method according to the present embodiment is a substrate made of such a material as, for example, silicon, silicon carbide (SiC) or some other semiconductor or of a material such as sapphire, glass or quartz. A front face 1a of the wafer 1 is partitioned into a plurality of regions by streets 3 arrayed in a grid pattern. The streets 3 include first streets 3a extending in a first direction 1c and second streets 3b extending in a second direction 1d crossing with the first direction 1c. In each of the regions partitioned by the streets 3, a device 5 such as an IC is formed. The wafer 1 is finally divided along the streets 3 to form individual chips.

Now, a processing method for the wafer 1 according to the present embodiment is described. In the processing method, a surface protective tape sticking step of sticking a surface protective tape to the front face 1a of the wafer 1 is carried out. After the surface protective tape sticking step, a modified layer formation step of forming a modified layer that serves as a start point of division along the streets 3 of the wafer 1 is carried out. After the modified layer formation step is carried out, a grinding step of grinding the rear face 1b of the wafer 1 to divide the wafer 1 into individual device chips is carried out. It is to be noted that, in the modified layer formation step or the grinding step, cracks are caused to extend from the modified layer to the front face 1a of the wafer 1. Then, if the cracks extend through the wafer 1 in its thicknesswise direction or if the rear face 1b side of the wafer 1 is ground until the cracks are exposed to the rear face 1b side, then the wafer 1 is divided into individual device chips. In the following, the steps of the processing method for the wafer according to the present embodiment are described in detail.

Figure 1B:
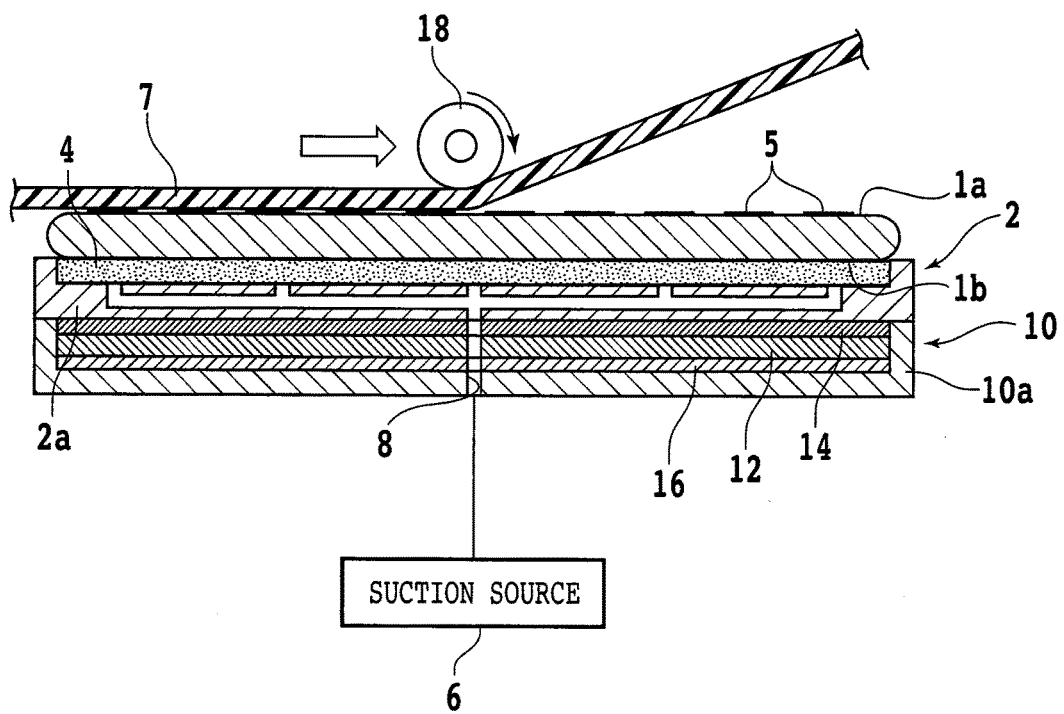
FIG. 1B is a sectional view schematically illustrating a surface protective tape sticking step.

The surface protective tape sticking step is described with reference to FIG. 1B. In the surface protective tape sticking step, a surface protective tape 7 is stuck to the front face 1a of the wafer 1. The surface protective tape 7 has a function for protecting, while the processing method of a wafer according to the present embodiment is carried out, the front face 1a side of the wafer 1 from impact applied in the steps, upon transportation and so forth to prevent the devices 5 from being damaged.

First, a chuck table 2 that is used in the surface protective tape sticking step is described. The chuck table 2 has a frame member 2a having a recessed portion, and a holding unit 4 formed from a porous material and filling up the recessed portion of the frame member 2a. The chuck table 2 has, in the inside thereof, a suction path 8 connected at one end thereof to a suction source 6, and the suction path 8 is connected at the other end thereof to the holding unit 4. The wafer 1 placed on the holding unit 4 is acted upon by negative pressure generated by the suction source 6 through porosities in the holding unit 4 such that the wafer 1 is sucked to and held on the chuck table 2. The chuck table 2 further has a heating unit 10 below the holding unit 4. The heating unit 10 has a function for heating the wafer 1 sucked to and held on the chuck table 2. The heating unit 10 has a frame member 10a having a recessed portion thereon. In the recessed portion, a heating element (heating means) 12, a plate 14 on the heating element 12 and a heat insulating material 16 below the heating element 12 are disposed.

The heating element 12 is a heating wire, for example, wound spirally and is controlled by a controller (not depicted) such that the heating element 12 generates heat to a predetermined temperature. Heat generated by the heating element 12 is suppressed from being transmitted downwardly by the heat insulating material 16 provided at the location under the heating element 12 while upward transmission thereof is promoted by the plate 14 provided over the heating element 12. It is to be noted that, for example, aluminum having high thermal conductivity is used for the plate 14. By such a structure as just described, the heating unit 10 can efficiently heat the wafer 1 on the chuck table 2.

In the surface protective tape sticking step, the wafer 1 is placed in a state in which the front face 1a thereof is directed upwardly on the holding unit 4 of the chuck table 2. Then, the suction source 6 is rendered operative to apply negative pressure to the wafer 1 through the suction path 8 and the porous member of the holding unit 4 to suck and hold the wafer 1 to and on the chuck table 2. Then, the heating element 12 of the heating unit 10 is energized to cause the heating element 12 to generate heat. The heat generated by the heating element 12 is transmitted to the wafer 1 sucked to and held on the chuck table 2 to heat the wafer 1. In a state in which the temperature of the wafer 1 becomes a predetermined temperature, the surface protective tape 7 is stuck to the front face 1a of the wafer 1. In the present embodiment, in order to make such sticking more certain, a roller 18 is placed on the surface protective tape 7 stuck to the front face 1a of the wafer 1 such that sticking is performed while the surface protective tape 7 is pulled by the roller 18 such that no wrinkle occurs with the surface protective tape 7.

The surface protective tape 7 has a film-like base material having flexibility, and a glue layer (adhesive layer) formed on one of faces of the base material. For example, polyethylene terephthalate (PET), polyolefin (PO), polyvinylchloride, polystyrene or the like is used for the base material. The base material may be formed by stacking two or more layers made of different materials. Meanwhile, for the glue layer (adhesive layer), for example, silicone rubber, acrylic material, epoxy material or the like is used. The surface protective tape 7 is stuck such that the glue layer is directed toward the front face 1a of the wafer 1. When the surface protective tape 7 is stuck to the heated wafer 1, heat is transmitted from the wafer 1 to the surface protective tape 7 to heat the surface protective tape 7. Since the glue layer of the surface protective tape 7 is softened together with rise of the temperature, when it contacts with the heated wafer 1, the glue layer is softened. When the glue layer is softened, the close contactness of the glue layer to the front face 1a of the wafer 1 increases, and therefore, also after the wafer 1 is divided into individual chips, the individual chips are held firmly.

Accordingly, even if a chip is acted upon by force by grinding after the wafer 1 is divided into the individual chips, the chip is less likely to move. Since this can reduce also the frequency of contact between corner portions of chips, damage such as cracking or chipping becomes less likely to occur.

It is to be noted that the surface protective tape 7 may not be heated by heat transmitted from the wafer 1, but, for example, a heating element may be provided on the roller 18 such that the surface protective tape 7 is heated by heat transmitted from the heating element through the roller 18. Alternatively, the surface protective tape 7 may be heated by a lamp or hot air after it is stuck to the front face 1a of the wafer 1. As the temperature becomes higher, the glue layer of the surface protective tape 7 is more likely to be softened and is head to a temperature, for example, equal to or higher than 40° C., preferably equal to or higher than 50° C. However, if the temperature of the surface protective tape 7 becomes excessively high, then the base material or the glue layer of the surface protective tape 7 melts, and the surface protective tape 7 no more exhibits its function. Therefore, the heating temperature must be lower than the temperature at which the base material or the glue layer melts. It is to be noted that, the temperature at which the base material or the glue layer melts differs according to the material. For example, PET is used for the base material, it does not melt at a temperature up to approximately 90° C., and where PO is used, it does not melt at a temperature up to approximately 70° C.

Figure 2A:
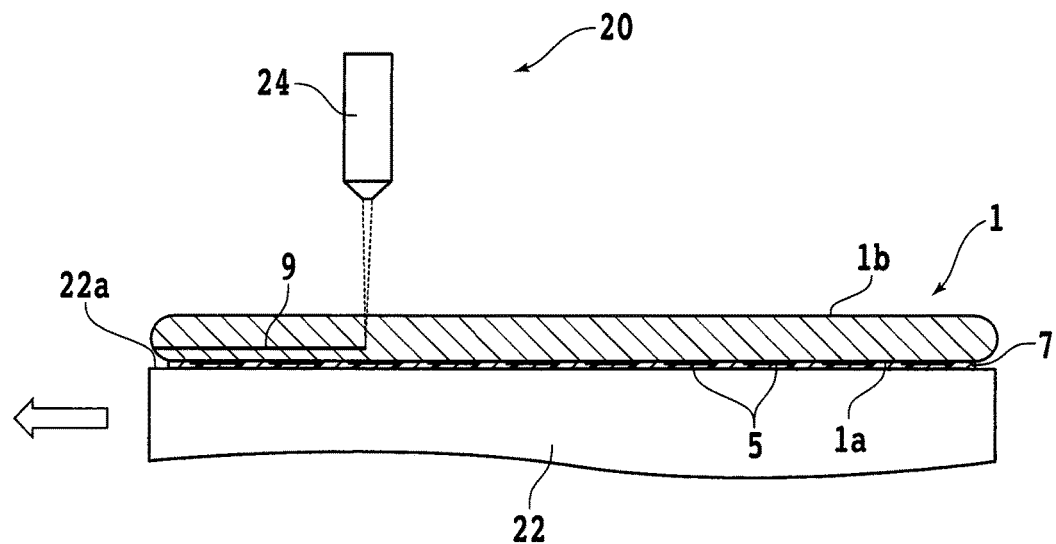
FIG. 2A is a partial sectional view schematically illustrating a modified layer formation step.

Now, the modified layer formation step according to the present embodiment is described with reference to FIG. 2A. The modified layer formation step is carried out before or after the surface protective tape sticking step is carried out. Especially, where the modified layer formation step is carried out after the surface protective tape sticking step, this is preferable because the front face 1a of the wafer 1 is protected also in the modified layer formation step. In the modified layer formation step, a laser beam is irradiated from the rear face 1b side of the wafer 1 such that it is condensed at a predetermined depth in the inside of the wafer 1 to form a modified layer 9. A laser processing apparatus 20 that is used in the modified layer formation step includes a chuck table 22 for sucking and holding a wafer 1, and a processing head 24 for oscillating a laser beam.

The chuck table 22 has, in the inside thereof, a suction path (not depicted) connected at one end thereof to a suction source (not depicted), and the suction path is connected at the other end thereof to a holding face 22a of the chuck table 22. Since the holding face 22a is configured from a porous material and the wafer 1 placed on the holding face 22a is acted upon by negative pressure generated by the suction source through the porosities in the holding unit 4, the wafer 1 is sucked to and held on the chuck table 22. The processing head 24 has a function for oscillating laser beams that are transparent to the wafer and condensing the laser beams to a predetermined depth in the inside of the wafer 1 such that a modified layer 9 is formed at the predetermined depth. It is to be noted that, for the laser beam, a laser beam oscillated, for example, using neodymium-doped yttrium aluminium garnet (Nd:YAG) as a medium is used.

The laser processing apparatus 20 can move the chuck table 22 in a processing feeding direction (for example, a direction of an arrow mark in FIG. 2A) of the laser processing apparatus 20 by processing feeding means (processing feeding mechanism not depicted) powered by a stepping motor or the like. Upon processing of the wafer 1, the chuck table 22 is fed in the processing feeding direction to feed the wafer 1 by processing feeding. Further, the chuck table 22 is rotatable around an axis substantially perpendicular to the holding face 22a and can change the processing feeding direction of the chuck table 22. Further the laser processing apparatus 20 can move the chuck table 22 in an indexing feeding direction (not depicted) of the laser processing apparatus 20 by indexing feeding means (indexing feeding mechanism not depicted) powered by a stepping motor or the like.

In the modified layer formation step, the front face 1a of the wafer 1 is directed to the lower side, and in this orientation, the wafer 1 is placed on the chuck table 22 of the laser processing apparatus 20. Then, negative pressure is applied through the chuck table 22 to suck and hold the wafer 1 to and on the chuck table 22. After the wafer 1 is sucked and held, the relative position of the chuck table 22 and the processing head 24 is adjusted such that a modified layer 9 can be formed along each street 3. Then, a laser beam is irradiated upon the rear face 1b of the wafer 1 from the processing head 24 of the laser processing apparatus 20. After the laser beams are condensed to the predetermined depth, a modified layer (start point of division) 9 is formed. While the laser beam is irradiated such that the modified layer 9 is formed along each street 3, the chuck table 22 is moved to feed the wafer 1 by processing feeding.

After the modified layer 9 is formed along one street 3, the modified layer (start point of division) 9 is successively formed along adjacent streets 3. Further, the chuck table 22 is rotated to change over the direction in which the wafer 1 is to be fed by processing feeding, and thereafter, the laser beam is irradiated similarly to form the modified layer 9 along all of the streets 3. It is to be noted that, depending upon an irradiation condition of the laser beam, after the modified layer 9 is formed, cracks extending from the modified layer 9 to the front face 1a of the wafer 1 can be formed. Where cracks can be formed in the modified layer formation step in this manner, there is no necessity to separately carry out a step of forming cracks, and the process can be simplified.

Now, the grinding step is described with reference to FIG. 2B. The grinding step is carried out after the modified layer formation step. In the grinding step, the rear face 1b side of the wafer 1 is ground to thin the wafer 1 to a predetermined thickness. If cracks that serve as a boundary upon division are not formed in the modified layer formation step, then cracks are formed in the grinding step. In this case, external force generated by grinding is applied to the modified layer 9 to form cracks. If the rear face 1b of the wafer 1 on which the cracks are formed is ground, then the wafer 1 can be divided into individual chips.

Figure 2B:
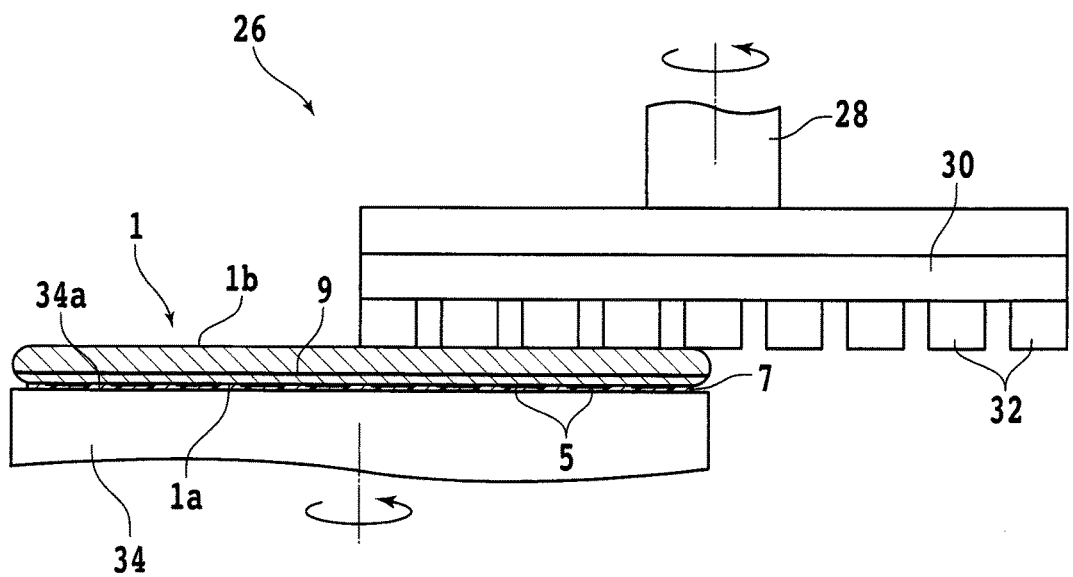
FIG. 2B is a partial sectional view schematically illustrating a grinding step.

FIG. 2B is a partial sectional view schematically illustrating the grinding step. A grinding apparatus 26 includes a spindle 28 that configures a rotary shaft perpendicular to a grinding wheel 30, and the disk-shaped grinding wheel 30 mounted on one end side of the spindle 28 and including a grindstone 32 on the lower side thereof. A rotational driving source (not depicted) such as a motor is connected to the other end side of the spindle 28 such that, if the motor rotates the spindle 28, then also the grinding wheel 30 mounted on the spindle 28 rotates. Further, the grinding apparatus 26 has a chuck table 34 opposing to the grinding wheel 30 for holding a workpiece thereon. A holding face 34a of the grinding wheel 30 is configured from a porous material connected to a suction source (not depicted). It is to be noted that the chuck table 34 is rotatable around an axis substantially perpendicular to the holding face 34a. Further, the grinding apparatus 26 has a lifting mechanism (not depicted), and the grinding wheel 30 is fed (downwardly moved) by processing feeding by the lifting mechanism.

First, the front face 1a of the wafer 1 is directed to the lower side, and in this state, the wafer 1 is placed on the holding face 34a of the chuck table 34. Then, negative pressure from the suction force is caused to act through the porous material to suck and hold the wafer 1 to and on the chuck table 34. Upon grinding, the chuck table 34 is rotated while the spindle 28 is rotated to rotate the grinding wheel 30. In the state in which the chuck table 34 and the grinding wheel 30 rotate, the grinding wheel 30 is fed (downwardly moved) processing feeding until the grindstone 32 is brought into contact with the rear face 1b, whereupon grinding of the rear face 1b is started. Then, the grinding wheel 30 is further fed by processing feeding such that the wafer 1 comes to have a predetermined thickness. If cracks are not formed in the modified layer formation step described hereinabove, or if formation of cracks is insufficient, then cracks are formed in the grinding step. In particular, force generated by grinding is applied to the inside of the wafer 1 such that cracks are extended in the thicknesswise direction of the wafer 1 from the modified layer 9. If the rear face 1b of the wafer 1 on which the cracks are formed is ground, then gaps are formed along the streets 3 and the wafer 1 is divided into the individual chips.

In the processing method according to the present embodiment, when the wafer 1 is thinned in the grinding step, the wafer 1 is divided into individual device chips. Therefore, there is no necessity to carry out a separate step only for dividing the wafer 1 into individual device chips, and therefore, the fabrication process for device chips is simplified. On the other hand, since the grinding is continued also after individual chips are formed, the individual chips are acted upon by force in a direction in a plane parallel to the holding face 34a. However, in the processing method according to the present embodiment, since the surface protective tape 7 has been heated in the surface protective tape sticking step and therefore the adhesive strength of the surface protective tape 7 to the chips has been strengthened, the chips are less likely to move. In other words, since the formed chips are supported firmly by the surface protective tape 7, movement of the individual chips by grinding is suppressed. Therefore, also contact between corner portions of chips is suppressed, and occurrence of chipping or cracking of the chips is suppressed. Through the steps described above, chips are formed by the processing method according to the present embodiment.

Now, a test in which operational effects of the processing method according to the present embodiment were verified is described. In the present test, chips were fabricated in accordance with a plurality of different heating conditions, and the number of damages occurring with the chips was counted for the individual conditions. It is to be noted that, in the conditions, a same wafer and a same surface protective tape were used. By the present test, knowledge relating to a relationship between the heating conditions and the number of damages was obtained. In the present test, four silicon wafers of a diameter of 12 inches were used as samples, and the test was performed while only the heating conditions in the surface protective tape sticking step were made different among the four silicon wafers. Further, as the surface protective tape, a tape in which a glue layer of a thickness of 20 µm is formed on a base material of a thickness of 50 µm formed from PET was used.

First, the surface protective tape sticking step was carried out for the samples. For the sample A, the roller on the surface protective tape stuck to the front face of the wafer was heated to 50° C. to heat the surface protective tape. For the sample B, the heating element for the chuck table was heated to 50° C. to heat the surface protective tape. For the sample C, the heating element for the chuck table was heated to 90° C. to heat the surface protective tape. For the sample D, as a comparison test, the surface protective tape sticking step was carried out at a room temperature without performing heating. Then, a similar modified layer formation step was carried out to the samples to form a modified layer, which serves as a start point for division along each street of the samples, and form cracks extending from the modified layer to the front face 1a of the wafer 1. Thereafter, a similar grinding step was carried out for the samples to ground each sample from the rear face to thin the sample thereby to divide the sample into individual chips. After the grinding step was carried out, the number of damages such as cracking or corner chipping occurring with the chips was counted. For the counting, an infrared camera to which an objective lens with a magnification of 200 times was attached was used to observe the samples and count the number of damages of a size equal to or greater than 5 µm.

The counted number of damages was twenty three in the sample A (roller heating, 50° C.); seven in the sample B (chuck table heating, 50° C.); three in the sample C (chuck table heating, 90° C.); and thirty two in the sample D (no heating). If the results of the samples are compared with each other, then it can be recognized that the number of damages decreases as the heating temperature increases. For example, if the result of the sample C and the result of the sample D are compared with each other, then it can be recognized that, if a surface protective tape is heated at a temperature near to the melting temperature of the material of the same, the number of damages can be reduced to less than 10% in comparison with that where the surface protective tape is not heated.

If a surface protective tape is heated, then it is softened and the close contactness thereof with the front face of a wafer is enhanced. Consequently, since, after the wafer is divided into individual chips, the chips are supported firmly by the surface protective tape, contact between corner portions of the chips is suppressed. As a result, occurrence of damages such as chipping or cracking to the chips is suppressed. By the present test, such an effect of the processing method for a wafer according to the present embodiment as just described was confirmed. Further, if the result of the sample A and the result of the sample B are compared with each other, then it is recognized that they exhibit a difference in number of damages depending upon a heating method even if heating to an equal temperature is performed. This arises from the fact that the transmission of heat to the surface protective tape differs depending upon the heating method, and heat is transmitted more readily to the surface protective tape and the temperature of the surface protective tape becomes higher by heating by the chuck table than by heating by the roller. From the results described above, it was confirmed that occurrence of damages to chips can be suppressed by the processing method according to the present embodiment.

Figure 3:
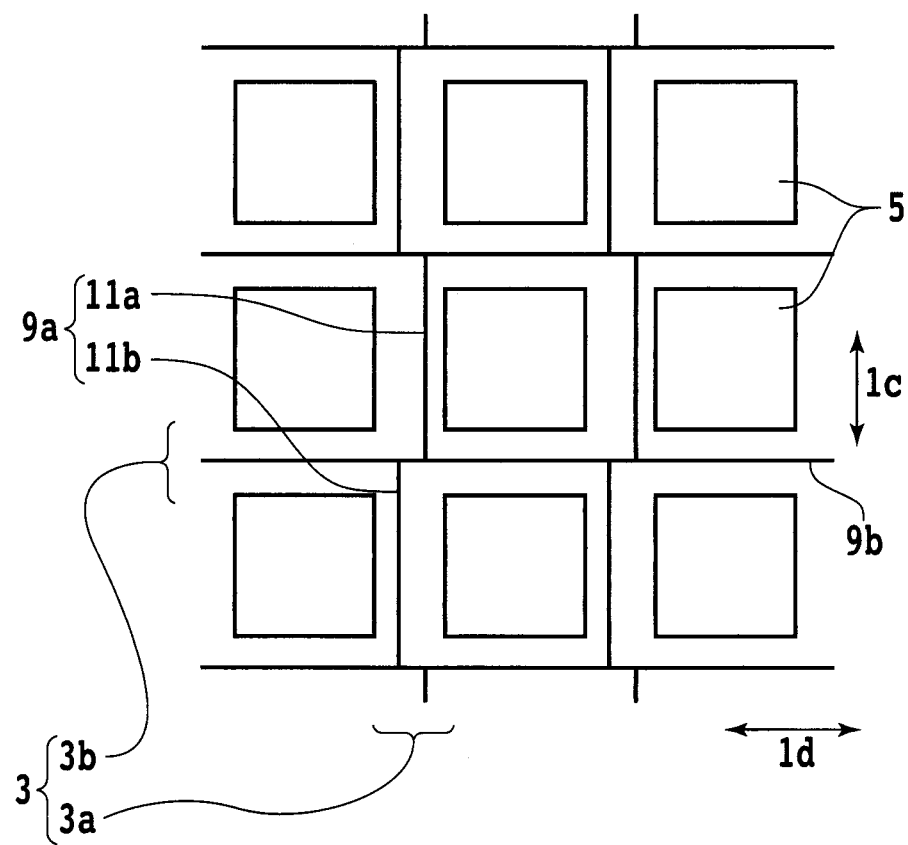
FIG. 3 is a top plan view illustrating a positional relationship among streets, devices and a modified layer.

It is to be noted that the present invention is not limited to the description of the embodiment described above and can be carried out in various modifications and alterations. For example, although, in the embodiment described above, a linear modified layer 9 is formed along each street 3 on the wafer 1, the present invention is not limited to this. For example, also it is possible to form a plurality of modified layers 9 having distances different from each other from the devices 5 in each street 3. A modified layer 9 of such a form as just described is described with reference to FIG. 3. As depicted in FIG. 3, a plurality of streets 3 of the wafer 1 include a first street 3a extending in the first direction 1c and a second street 3b extending in the second direction 1d crossing with the first direction 1c.

In the modified layer formation step, for example, a first modified layer 9a extending along the first street 3a and a second modified layer 9b extending along the second street 3b are formed. The first modified layer 9a has a first portion 11a on one side and a second portion 11b on the other side across an arbitrary second street 3b. The first portion 11a of the first modified layer 9a and the second portion 11b of the first modified layer 9a do not exist on one linear line but are displaced from each other in the second direction 1d. Where the first modified layer 9a is formed linearly, if a formed chip is moved by grinding, then a corner portion of the chip is brought into contact with a corner portion of a different chip positioned adjacent the corner portion side of the chip. Since the corner portion of the chip is vulnerable to impact, if impact is applied to the corner portion of the chip by contact between the corner portions, then the chip is likely to suffer from damage such as chipping or cracking. Therefore, if the first portion 11a of the first modified layer 9a and the second portion 11b of the first modified layer 9a are formed in a displaced relationship from each other in the second direction 1d, then the adjacent corner portions of the chips are spaced away from each other by the distance of the displacement. Therefore, if the surface protective tape is heated in the surface protective tape sticking step to strengthen the sticking of the chips to the wafer 1 and the modified layers 9 are formed in such a manner as described above, then the corner portion of the chip becomes less likely to contact with the adjacent corner portion of the adjacent chip, and occurrence of damage to the corner portion of the chip is suppressed.

Meanwhile, the first portion 11a and the second portion 11b of the first modified layer 9a may be formed so as to be spaced from the adjacent second modified layer 9b. In particular, a predetermined distance is provided between an end portion of the first portion 11a or an end portion of the second portion 11b of the first modified layer 9a and the second modified layer 9b adjacent the end portion. When the first modified layer 9a is formed, if an error or the like in processing feeding occurs, then an end portion of the first portion 11a or an end portion of the second portion 11b may not terminate at a predetermined position but terminate at a position advanced in the first direction 1c than the predetermined position. Therefore, when an end portion of the first portion 11a or an end portion of the second portion 11b of the first modified layer 9a and the second modified layer 9b adjacent the end portion are spaced from each other, the first modified layer 9a is sometimes formed across the second modified layer 9b. A portion that protrudes from the second modified layer 9b from within the first modified layer 9a formed across the second modified layer 9b may remain on a chip formed therearound and serve as a start point of chipping or cracking. Therefore, in order to prevent such a start point from remaining on a chip to be formed even if an error or the like occurs in processing feeding, the first portion 11a and the second portion 11b of the first modified layer 9a are preferably formed in a spaced relationship from an adjacent second modified layer 9b.

A method for forming the first portion 11a of the first modified layer 9a and the second portion 11b of the first modified layer 9a in a displaced relationship from each other in the second direction 1d as depicted in FIG. 3 is described. In the modified layer formation step, a first portion 11a of a first modified layer 9a is formed over the overall length of the first street 3a first. In particular, every time the wafer 1 is fed by processing feeding by a length substantially equal to the length of one side of a chip along the first street 3a, oscillation and stopping of the laser are repeated to form the first portion 11a of the first modified layer 9a over the overall length of the first street 3a. Then, the wafer 1 is fed indexing feeding by a predetermined distance within the width of the first street 3a in the second direction 1d and the second portion 11b of the first modified layer 9a is formed along the first street 3a. In other words, every time the wafer 1 is fed by processing feeding by a distance substantially equal to the length of one side of a chip along the first street 3a, oscillation and stopping of the laser are repeated to form the second portion 11b of the first modified layer 9a so as to be disposed between two first portions 11a. Consequently, an end portion of each first portion 11a and an adjacent end portion of an adjacent second portion 11b are spaced by a distance equal to or longer than the predetermined distance.

After the first modified layer 9a including the first portions 11a and the second portions 11b is formed along one first street 3a, the wafer 1 is successively fed by indexing feeding by a distance substantially equal to the length of one side of a chip to successively form the modified layer 9. After the modified layer 9 is formed along the street 3 parallel to the first direction 1c, the wafer 1 is rotated such that the wafer 1 can thereafter be fed by processing feeding to successively form the modified layer 9 along the street 3 parallel to the second direction 1d. Consequently, such a modified layer 9 as depicted in FIG. 3 can be formed over the overall area of the wafer 1. It is to be noted that, while the description above is directed to the case in which the first modified layer 9a is formed separately from the first portion 11a and the second portion 11b, also the second modified layer 9b to be formed along the second street 3b may be formed as two portions displaced from each other in the first direction 1c.

Further, the structure, method and so forth of the embodiment described above can be carried out in a suitably modified manner without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a wafer having a front face that is partitioned by a plurality of streets crossing with each other into a plurality of regions in each of which a device is formed, comprising:
   a surface protective tape sticking step of sticking a surface protective tape to the front face of the wafer;
   a modified layer formation step of irradiating, after the surface protective tape sticking step is carried out, a laser beam along the streets from a rear face side of the wafer to form a modified layer in an inside of the wafer; and
   a grinding step of grinding, after the modified layer formation step is carried out, the wafer from the rear face side to thin the wafer,
   wherein:
   in the surface protective tape sticking step, the surface protective tape is stuck while the surface protective tape is heated, in the modified layer formation step or in the grinding step, cracks are formed to extend from the modified layer to the front face of the wafer, and in the grinding step, the wafer is divided into individual chips with the cracks serving as boundaries;

wherein the plurality of streets include a first street extending in a first direction and a second street extending in a second direction crossing with the first direction, wherein the modified layer formed in the modified layer formation step includes a first modified layer extending along the first street and a second modified layer extending along the second street, wherein the first modified layer has a first portion on one side and a second portion on the other side across the second street, and wherein in the modified layer formation step, the first portion of the first modified layer and the second portion of the first modified layer are formed in a displaced relationship from each other in the second direction.

* * * * *